(12) United States Patent
Cohen et al.

(10) Patent No.: US 11,092,953 B2
(45) Date of Patent: Aug. 17, 2021

(54) METHOD AND SYSTEM FOR HVAC MALFUNCTION AND INEFFICIENCY DETECTION OVER SMART METERS DATA

(71) Applicant: GRID4C, Tel Aviv (IL)

(72) Inventors: Eran Cohen, Ramat Gan (IL); Alexander Zak, Jerusalem (IL); Eran Samuni, Giv'atayim (IL)

(73) Assignee: GRID4C, Tel Aviv (IL)

( * ) Notice: Subject to any disclaimer, the term of this patent is extended or adjusted under 35 U.S.C. 154(b) by 446 days.

(21) Appl. No.: 16/093,399

(22) PCT Filed: Apr. 9, 2017

(86) PCT No.: PCT/IL2017/050436
§ 371 (c)(1),
(2) Date: Oct. 12, 2018

(87) PCT Pub. No.: WO2017/179049
PCT Pub. Date: Oct. 19, 2017

(65) Prior Publication Data
US 2019/0121337 A1    Apr. 25, 2019

Related U.S. Application Data

(60) Provisional application No. 62/321,306, filed on Apr. 12, 2016.

(51) Int. Cl.
*G05B 23/02* (2006.01)
*G06Q 50/06* (2012.01)
(Continued)

(52) U.S. Cl.
CPC .......... *G05B 23/0283* (2013.01); *F24F 11/00* (2013.01); *F24F 11/30* (2018.01);
(Continued)

(58) Field of Classification Search
CPC ........ F24F 11/38; F24F 11/39; G05B 23/0283
(Continued)

(56) References Cited

U.S. PATENT DOCUMENTS 10,274,382 B1 *  4/2019  Trundle ................... F24F 11/30
2008/0186160 A1 *  8/2008  Kim ......................... F24F 11/30
340/501

(Continued)

OTHER PUBLICATIONS

Machine Translation of JP2005084882A, Masataka Iwata, 2005.*

*Primary Examiner* — Ricky Go
(74) *Attorney, Agent, or Firm* — Browdy and Neimark, P.L.L.C.

(57) ABSTRACT

The present invention provides a method for determining conditions of malfunction or inefficiency of HVAC systems, within a plurality of monitored households, in which there are no sensors for directly measuring the power consumption per specific HVAC. The said method comprise the steps of: a. monitoring the power consumption of a plurality of households; b. monitoring the concurrent environmental conditions at the location of the said plurality of households; c. analyzing each household's power consumption, and extracting weighted failure indications of inefficient or malfunctioning HVAC systems; d. determining the probability of various HVAC conditions of malfunction of inefficiency, according to the said weighted indicators; and e. emitting a an alert in relation to the said condition of HVAC malfunction of inefficiency, comprising at least one of: HVAC malfunction type, probability, probable cause, and suggested action.

18 Claims, 16 Drawing Sheets

(51) Int. Cl.
  *F24F 11/00* (2018.01)
  *F24F 11/30* (2018.01)
  *G06Q 10/00* (2012.01)
  *G05B 15/02* (2006.01)
  *F24F 11/38* (2018.01)
  *F24F 11/39* (2018.01)
  *F24F 11/56* (2018.01)
  *G06N 20/00* (2019.01)
  *G01R 22/06* (2006.01)
  *F24F 11/32* (2018.01)
  *F24F 110/00* (2018.01)

(52) U.S. Cl.
  CPC ............. *F24F 11/38* (2018.01); *F24F 11/39* (2018.01); *F24F 11/56* (2018.01); *G01R 22/063* (2013.01); *G05B 15/02* (2013.01); *G06N 20/00* (2019.01); *G06Q 10/00* (2013.01); *G06Q 50/06* (2013.01); *F24F 11/32* (2018.01); *F24F 2110/00* (2018.01); *G05B 2219/2614* (2013.01)

(58) Field of Classification Search
  USPC .......................................................... 702/184
  See application file for complete search history.

(56) References Cited

U.S. PATENT DOCUMENTS

| | | | |
|---|---|---|---|
| 2014/0333322 A1 | 11/2014 | Kabler et al. | |
| 2015/0057810 A1* | 2/2015 | Smith | G05B 13/024 |
| | | | 700/276 |
| 2016/0328945 A1* | 11/2016 | Greisser | F24F 11/30 |
| 2017/0336091 A1* | 11/2017 | Arensmeier | G05B 23/024 |

\* cited by examiner

Training module 1100

Acquiring the following data per each household within the training group:
1. power consumption of the household over time;
2. power consumption of the HVAC over time;
3. HVAC-specific data;
4. household profile parameters; and
5. contemporary environmental conditions.

The said acquired data is henceforth referred to as "explanatory features", and serves to build the "disaggregation" classifier model and the "top percentage" classifier model, as elaborated below.

1110

Applying machine learning algorithms to build the disaggregation classifier model over the training group dataset, according to the said explanatory features. 1120
Said disaggregation classifier model consists of several classification subgroups.
Each classification subgroup relates to a specific percentage range of HVAC power consumption from the overall household power consumption, e.g.:
classification subgroup 1: households in which 0-10 % of household power is consumed by the HVAC.
classification subgroup 2: households in which 10-20 % of household power is consumed by the HVAC.
...
classification subgroup 10: households in which 90-100 % of household power is consumed by the HVAC.

Accumulating the power consumption data of households within the training group throughout the Autumn and Spring seasons. 1130

Dividing the training group households dataset into several (e.g. 5) partitions, according to household power consumption during the Autumn and Spring seasons, e.g.: 1140
Partition 1: 20% of households which consume the least amount of energy over Spring and Autumn seasons
Partition 2: 20% of households which consume the next amount of energy over Spring and Autumn seasons
...
Partition 5: 20% of households which consume the most amount of energy over Spring and Autumn seasons Applying machine-learning algorithms to each partition, to build a "top-percentage" classifier model per each partition, according to the said explanatory features. 1150
The top-percentage classifier model at each partition consists of two subgroups:
The "top-percentage" classification subgroup includes households that consume power at the top 1% of power consumption within that partition, and
The "rest" subgroup includes the rest 99% of the households within that partition.

FIG. 3

Analysis module 1300: Producing failure indicators relating to patterns of appliance power consumption.

Applying pattern recognition algorithms to the extracted HVAC power consumption data, to produce power consumption patterns. 1305

Identifying power consumption patterns that may indicate appliance malfunction or inefficiency. 1310

Identifying changes in power consumption patters, that may indicate appliance malfunction or inefficiency. 1315

Correlating power consumption patterns with contemporary readings of environmental conditions. 1320

Producing a weighted indicator of suspected appliance malfunction based on pattern recognition 1325

Fig. 5

Analysis module 1300: Producing failure indicators relating to trends in power consumption

- Identifying long-term trends of increase in each household's normalized, extracted HVAC power consumption. 1330
- Correlating said identified trends in power consumption with contemporary readings of environmental conditions. 1335
- Producing a weighted indicator of malfunction according to the identified trends in appliance power consumption. 1340

Fig. 6

Analysis module 1300: Producing failure indicators relating to incompatibility with normalized appliance consumption models Comparing each extracted, normalized HVAC power consumption with the expected consumption and EEC (Energy Efficiency Rating) of HVACs in similar environmental conditions and in regards to similar household profile parameters. 1345

Producing a weighted indication of incompatibility with the expected power consumption values. 1350

Fig. 7

Analysis module 1300: Producing failure indicators relating to top percentage of power consumption Monitoring the power consumption of households that are members of the "top-percentage" classification subgroup over time, to ascertain whether they consistently consume power at the top 1% of their partition, over a predefined significant portion of a number of consecutive days.
1355

Comparing the power consumption of the said top-percentage households with that of their peers, i.e. other households within their disaggregation classification subgroup.
1360

Producing a weighted failure indication of top percentage of power consumption
1365

Fig. 8

Decision module 1400 Producing system alerts

Aggregating the weighted values of malfunction indications provided by the Analysis module, and filtering out temporary or insignificant failure indications.  1410

Comparing the weighted values of filtered malfunction indications with a predefined set of thresholds, and produce a total score for each HVAC's functionality.  1420

Producing metrics according to the weighted levels of failure indicators. Said metrics including combinations of different indicator levels, and relations thereof. These metrics serve to point out plausible causes of HVAC failures, in relation to the aforementioned combinations and relations of indicator weighted levels.  1430

Comparing statistical metrics with a set of predefined thresholds, and issuing an alert in case said thresholds have been surpassed.  1440

Fig. 9

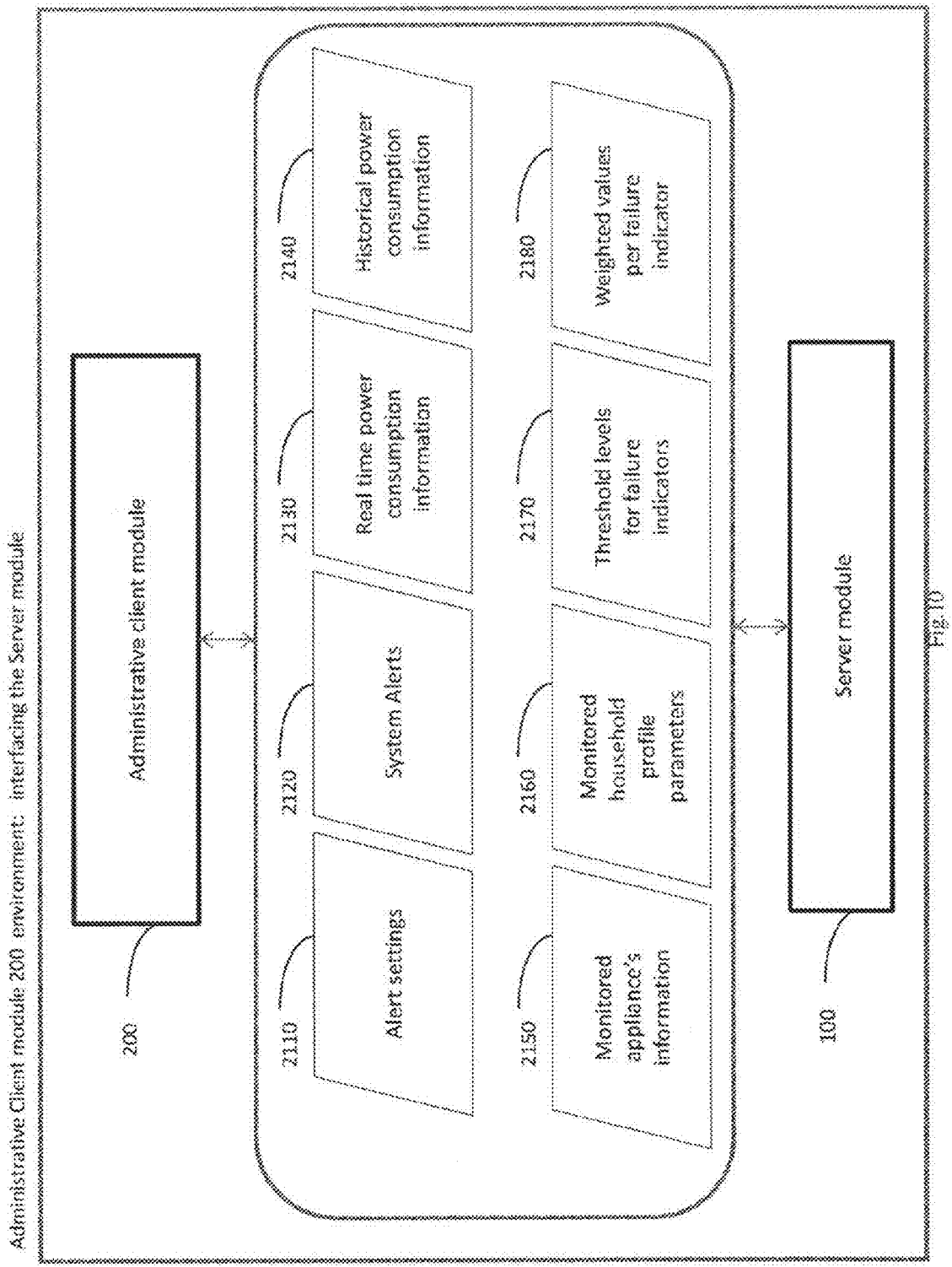

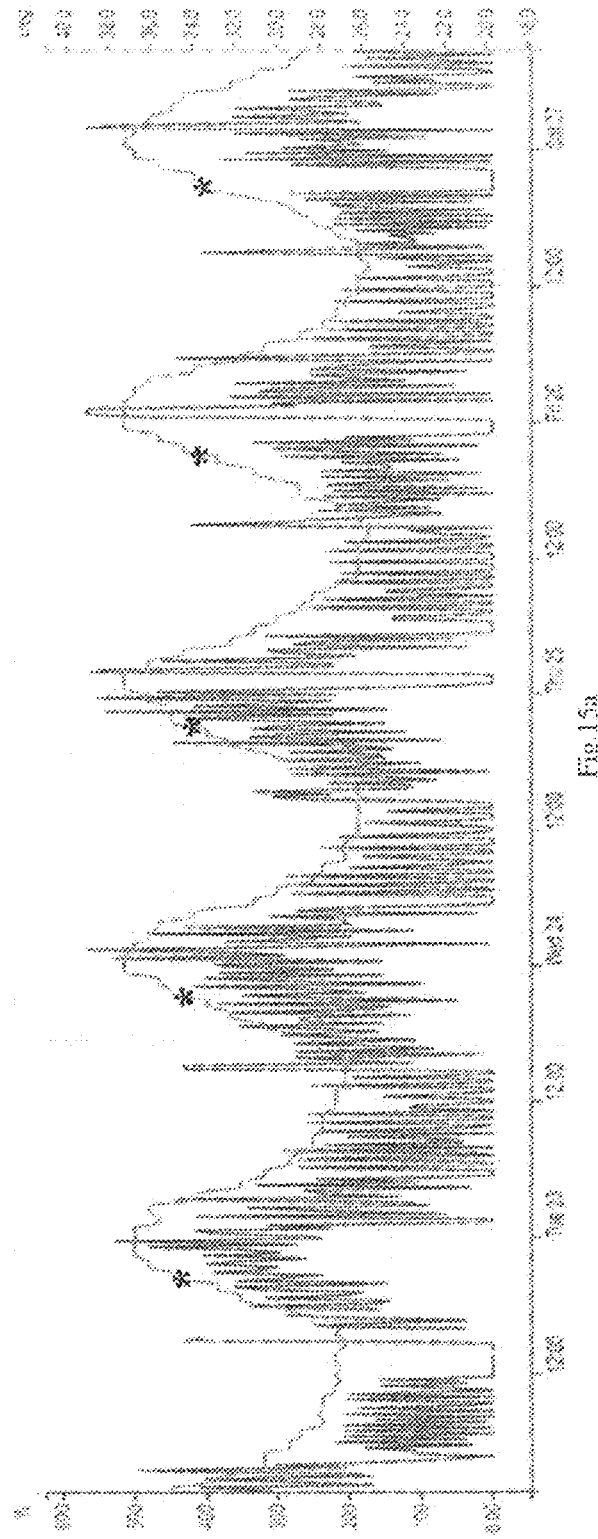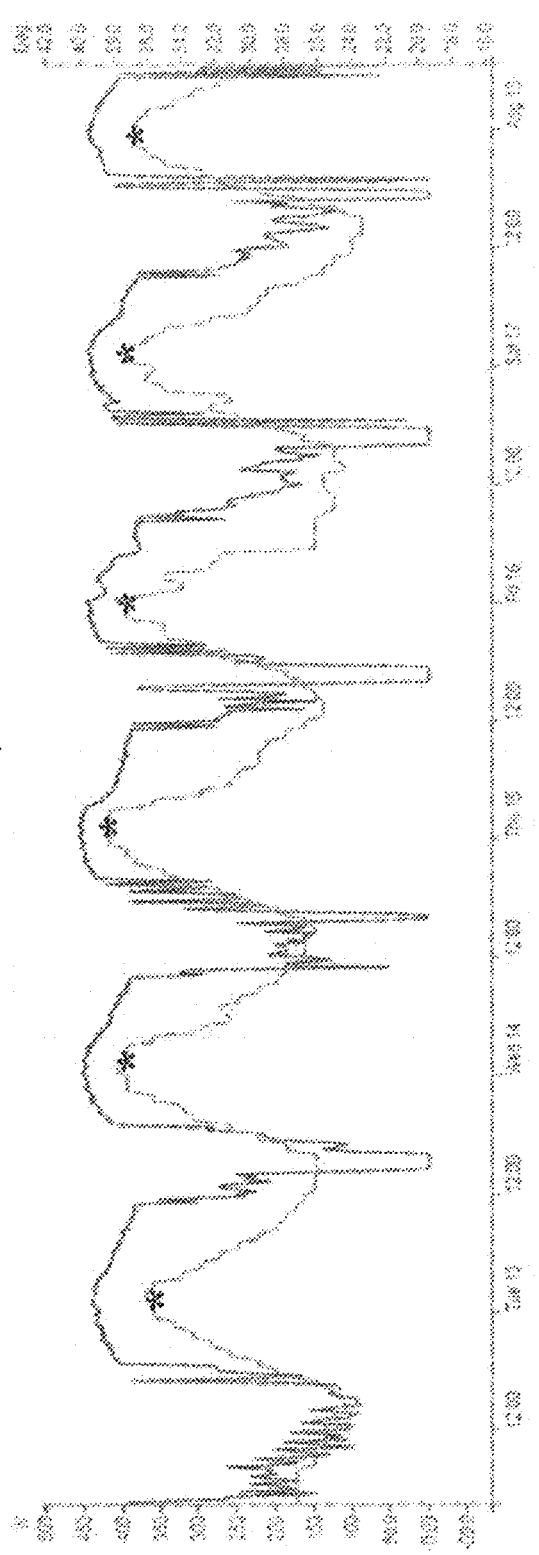
Fig. 15a
Fig. 15b

METHOD AND SYSTEM FOR HVAC MALFUNCTION AND INEFFICIENCY DETECTION OVER SMART METERS DATA

FIELD OF THE INVENTION

The invention generally relates to the field of monitoring electronic appliances, and particularly to the field of automatic detection of household appliance malfunction or inefficiency.

BACKGROUND ART

Power consumption of household appliances is the primary indication for proper functionality, and efficiency for the respective appliance. If accumulated and analyzed properly, this information could prevent appliance malfunction, and avoid power waste.

Prior art fails to disclose a system that would automatically extract, filter, analyze and categorize relevant information from multiple household main power meters, aggregate and analyze this data in real time, and facilitate action taking vis a vis specific findings. This prevents efficient detection of appliance system failure, and postpones servicing of high power-consuming appliances beyond optimal timeframes.

SUMMARY OF INVENTION

The present invention provides a method for determining conditions of malfunction or inefficiency of Heating Ventilation and Air Conditioning (HVAC) systems, within a plurality of monitored households, in which there are no sensors for directly measuring the power consumption per specific HVAC, said method implemented by one or more processors operatively coupled to a non-transitory computer readable storage device, on which are stored modules of instruction code that when executed cause the one or more processors to perform:
  a. monitoring the power consumption of a plurality of households;
  b. monitoring the concurrent environmental conditions at the location of the said plurality of households;
  c. analyzing each household's power consumption, and extracting weighted failure indications of inefficient or malfunctioning HVAC systems;
  d. determining the probability of various HVAC conditions of malfunction of inefficiency, according to the said weighted indicators;
  e. emitting a an alert in relation to the said condition of HVAC malfunction of inefficiency, comprising at least one of: HVAC malfunction type, probability, probable cause, and suggested action.

According to some embodiments, the analysis of households' power consumption is performed according to the following steps:
  a. obtaining elaborate data pertaining to each household within a household training group;
  b. applying machine learning algorithms to the said accumulated training group data, to build at least one classification model, thus classifying the households' training group to form classification subgroups;
  c. obtaining power consumption data and household profile information pertaining to a general group of monitored households, beyond the household training group;
  d. calculating the best fit of every household in the monitored group of households to said classification subgroups;
  e. extracting weighted failure indications of inefficient or malfunctioning HVAC systems.

According to some embodiments, the said data pertaining to each household within the household training group consists of at least one of: household power consumption, HVAC power consumption, contemporary environmental conditions, household profile parameters, residents' profile parameters, and HVAC specific data.

According to some embodiments, one of said classification models is a disaggregation classification model, which includes disaggregation classification subgroups, each relating to a specific percentage range of HVAC power consumption from the overall household power consumption.

According to some embodiments, the method further includes calculation of the best fit of every household in the monitored group of households to a said disaggregation classification subgroup, thus extracting the HVAC power consumption over time of each household in the monitored household group from the household's overall power consumption reading.

According to some embodiments, the method further includes applying a pattern recognition algorithm to the said extracted HVAC-specific power consumption over time, thus producing HVAC power consumption patterns, identifying power consumption patterns that indicate HVAC malfunction or inefficiency, and emitting an HVAC power-consumption-pattern failure indication weighted by the indicated malfunction's degree of certainty.

According to some embodiments, the method further includes applying a machine learning algorithm for normalizing the said extracted HVAC power consumption according to contemporary environmental conditions, residents' profiles and household profile parameters, by comparing the said household's extracted HVAC power consumption with that of its peers in the same disaggregation classification group, and with that of other disaggregation classification subgroups.

According to some embodiments, the method further comprises the steps of:
  a. applying a trend analysis algorithm to identify trends of increase in HVAC power consumption that are normalized in relation to environmental conditions; and
  b. emitting an indication of HVAC malfunction, according to said identified trend of increase in normalized power consumption, wherein said indication is weighted by the indicated malfunction's degree of certainty.

According to some embodiments, the method further comprises the steps of:
  a. comparing the extracted, normalized HVAC power consumption with the expected consumption and EEC (Energy Efficiency Rating) of HVACs in similar environmental conditions and in regards to similar household profile parameters.
  b. emitting an indication of HVAC malfunction, according to said comparison with expected consumption and EEC, wherein said indication is weighted by the indicated malfunction's degree of certainty.

According to some embodiments, the method further comprising the steps of:
  a. dividing the households of the training group to partitions according household power consumption during the autumn and spring seasons;

b. applying machine-learning algorithms to each partition, thus building a top-percentage classifier model per each partition;

c. wherein the top-percentage classifier model at each partition distinguishes the households that consume power at the top 1% of power consumption within their partition from the rest of the households within their partitions.

According to some embodiments, the households that consume power at the top 1% of their partition are monitored over a predefined number of consecutive days, to ascertain the following conditions:

the said households consistently consume power at the top 1% of their partition, over a predefined significant portion of the said predefined number of consecutive days; and the power consumption of the said households exceeds that of other households within their disaggregation classification subgroup, whereupon an indication of HVAC malfunction is emitted in case both said conditions are fulfilled, wherein said indication is weighted by the indicated malfunction's degree of certainty.

According to some embodiments, the method further comprising the steps of:

a. aggregating all said types of HVAC malfunction indications;

b. comparing the weighted values of malfunction indications with a predefined set of thresholds, and producing a total score for each HVAC's functionality;

c. producing metrics according to the weighted levels of said aggregated failure indicators;

d. wherein said metrics including combinations of different failure indication levels, and relations thereof;

e. determining the existence and probability of an HVAC condition of malfunction or inefficiency; and f. emitting an alert in relation to said determination of HVAC malfunction of inefficiency, comprising at least one of: HVAC malfunction type, probability, probable cause, and suggested action according to said metrics.

The present invention further provides a system for determining conditions of malfunction or inefficiency of Heating Ventilation and Air Conditioning (HVAC) systems, within a plurality of monitored households, in which there are no sensors for directly measuring the power consumption per specific HVAC, said system comprising a non-transitory computer readable storage device and one or more processors operatively coupled to the storage device on which are stored modules of instruction code executable by the one or more processors.

According to some embodiments, the system further comprises the following modules:

a. a plurality of household power meters, installed at a respective plurality of monitored households, and transmitting regular household power consumption readings to a server module;

b. the said server module, configured to monitor the said regular household power measurements and the concurrent environmental conditions at the location of the said plurality of monitored households;

c. a preprocessing module incorporated within the server module, configured to analyze each household's power consumption and extract weighted failure indications of inefficient or malfunctioning HVAC systems; and d. a decision module incorporated within the server module, configured to determine the probability of various HVAC conditions of malfunction or inefficiency, according to the said weighted failure indications, wherein said decision module is configured to emit an alert in relation to the said determined condition of HVAC malfunction or inefficiency, alert comprising at least one of: HVAC malfunction type, probability, probable cause, and suggested action.

According to some embodiments, the system further comprises a plurality of private client modules installed at households within a household training group, wherein said private client modules convey data pertaining to each household within the household training group to the server module, said data including at least one of: household power consumption, HVAC power consumption, contemporary environmental conditions, household profile parameters, residents' profile parameters, and HVAC specific data.

According to some embodiments, the system further comprises a training module incorporated within the server module, and configured to a. obtain elaborate data from the private client modules, pertaining to each household within the household training group; and b. apply machine learning algorithms to the said accumulated training group data, to build at least one classification model, thus classifying the households' training group to form classification subgroups.

According to some embodiments, the said analysis module is further configured to:

a. obtain power consumption data pertaining to a general group of monitored households, beyond the household training group;

b. calculate the best fit of every household in the monitored group of households to said classification subgroups; and c. extract weighted failure indications of inefficient or malfunctioning HVAC systems.

According to some embodiments, the said weighted failure indications of inefficient or malfunctioning HVAC systems include at least one of:

a. Power consumption patterns failure indication;

b. Trends of increase in power consumption failure indication;

c. Incompatibility with consumption models failure indication; and d. Top percentage power consumption failure indication.

BRIEF DESCRIPTION OF THE DRAWINGS

For a better understanding of various embodiments of the invention and to show how the same may be carried into effect, reference will now be made, purely by way of example, to the accompanying drawings in which like numerals designate corresponding elements or sections throughout With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings:

FIG. 3 illustrates the flow diagram of the training module according to some embodiments of the present invention. This module resides within the Server, and is responsible for dividing the training group dataset of households to classification subgroups according to two classification models: the "disaggregation" model, and the "top-percentage" model.

FIG. 5 is a flow diagram, depicting the process of producing failure indications relating to patterns of appliance power consumption in the analysis module, according to some embodiments of the present invention.

FIG. 6 is a flow diagram, depicting the process of producing failure indications relating to trends in power consumption in the analysis module, according to some embodiments of the present invention.

FIG. 7 is a flow diagram, depicting the process of producing failure indications relating to incompatibility with normalized appliance consumption models, according to some embodiments of the present invention.

FIG. 8 is a flow diagram, depicting the process of producing failure indications relating to top percentage of power consumption, according to some embodiments of the present invention.

FIG. 9 illustrates the flow diagram of the decision module according to some embodiments of the present invention.

This module resides within the server side and employs statistical logic over the accumulated data to produce a comprehensive report of monitored HVACs' status.

FIG. 10 illustrates a schematic block diagram of the administrative clients' module's functionality, according to some embodiments of the present invention. The Administrative Clients module is a software module that accommodates all administrative system customizations, including configuration of alert conditions and extraction of historical reports.

Figure 11:
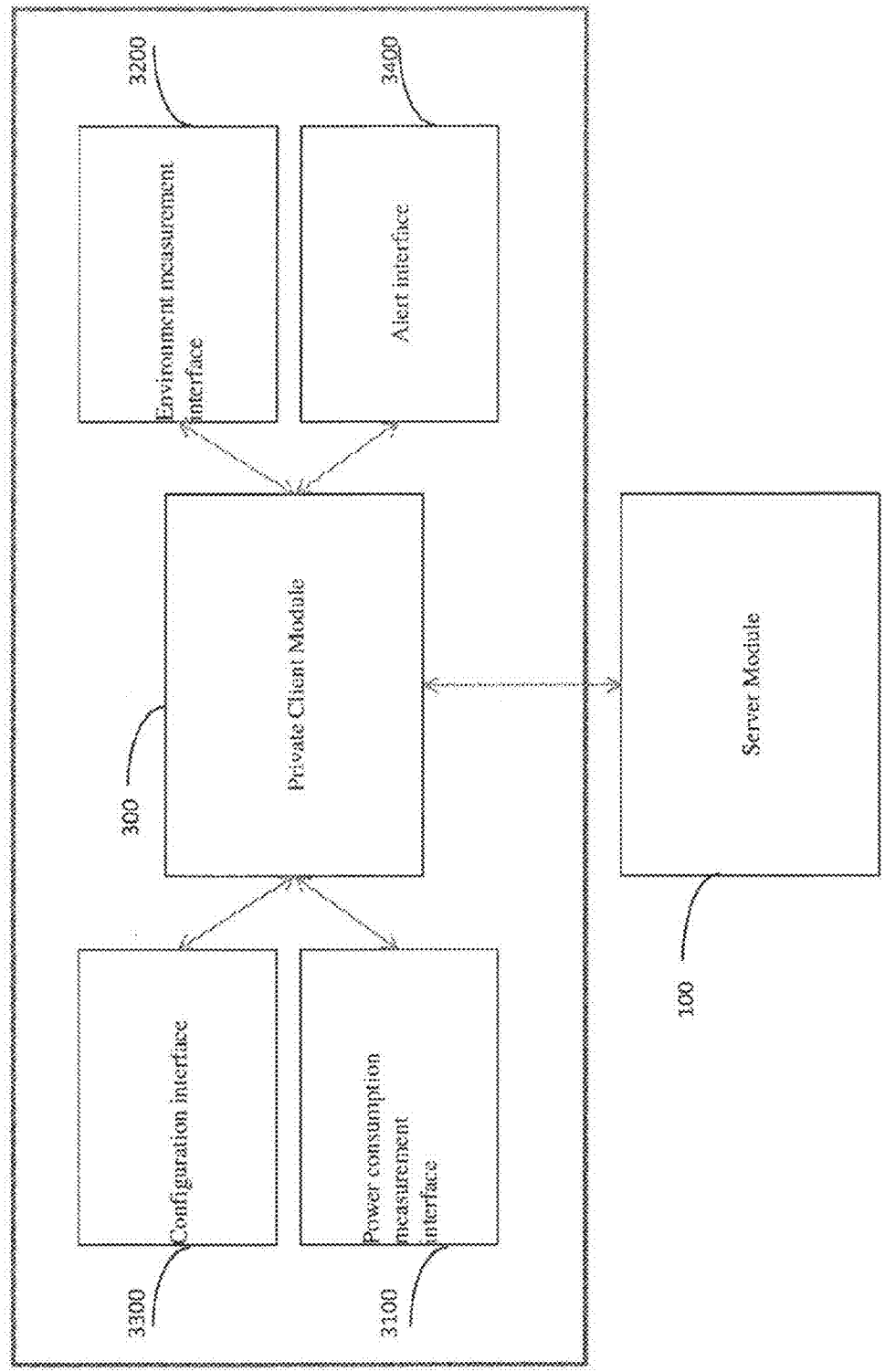

FIG. 11 illustrates a block diagram of the private clients' module environment, according to some embodiments of the present invention. This module obtains local physical measurements values, and propagates them to the Server module. The Private Clients module also provides some configuration and alerting capabilities for household clients.

Figure 12:
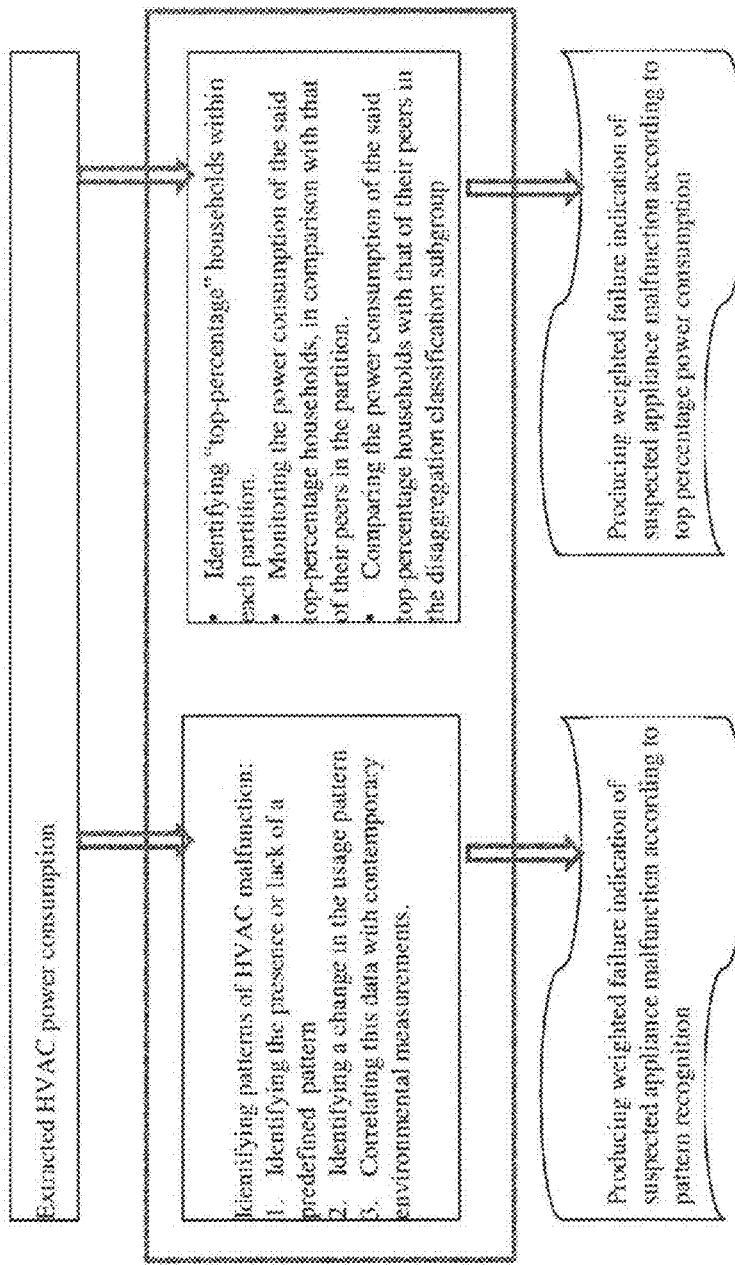
Figure 13:
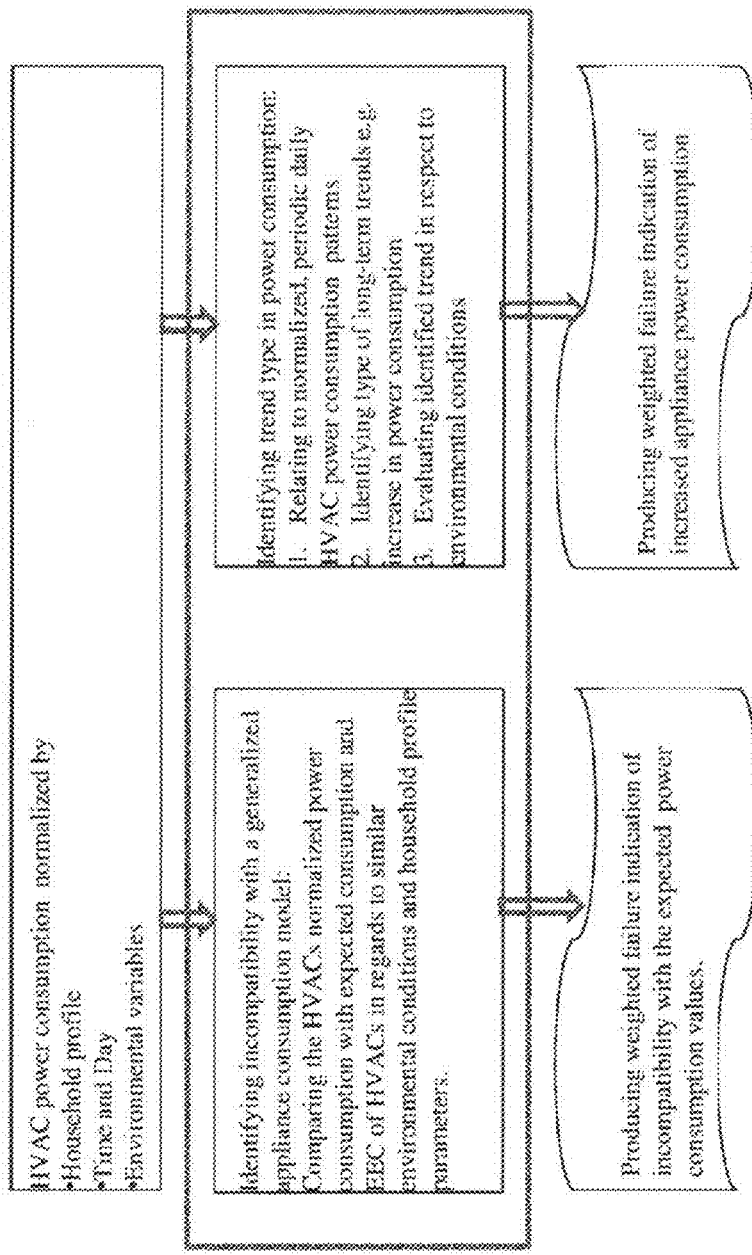

FIGS. 12 and 13 jointly present a conceptual block diagram, depicting the function of the analysis module.

Figure 14:
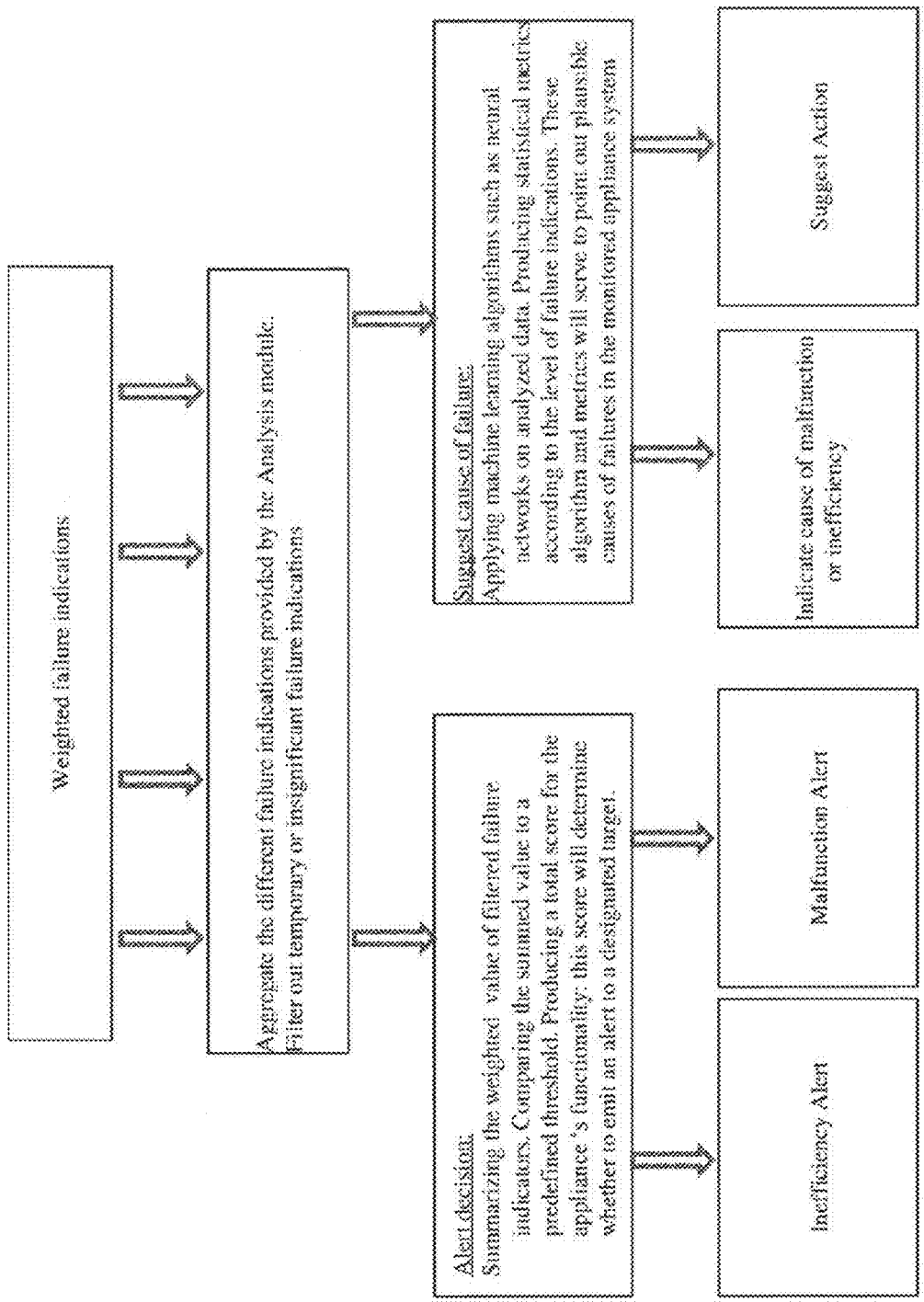

FIG. 14 is a conceptual block diagram depicting the function of the decisions module.

FIG. 15 illustrates a comparative view of two HVAC power consumption graphs: one presenting a saw-tooth power consumption pattern, characteristic of a normally functioning HVAC, while the other presents a pattern of inefficient HVAC power consumption.

Figure 16:
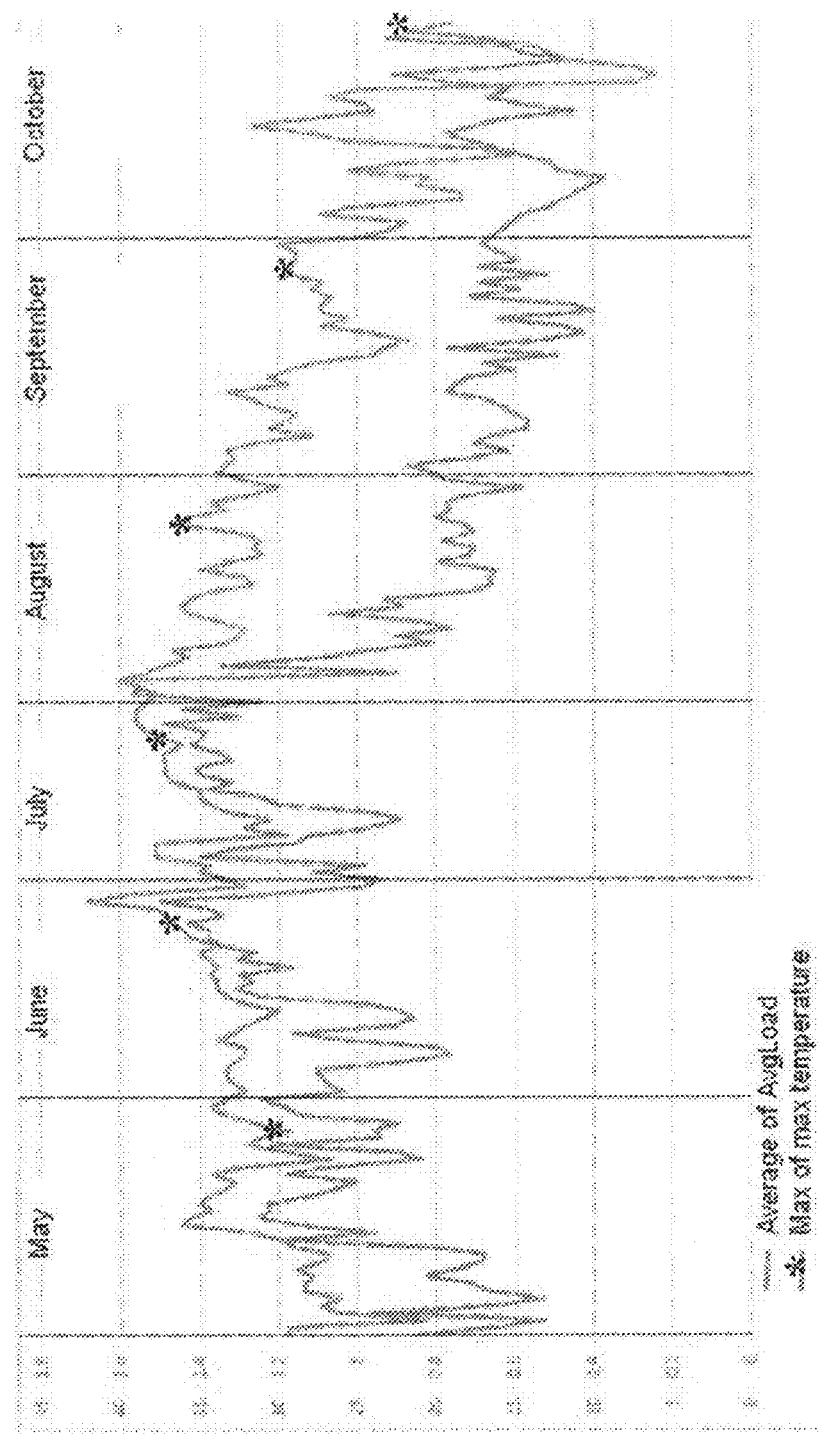

FIG. 16 illustrated a graph of HVAC power consumption, wherein a trend of increased power consumption over time is visible.

MODES FOR CARRYING OUT THE INVENTION

Before explaining at least one embodiment in detail, it is to be understood that the invention is not limited in its application to the details of construction and the arrangement of the components set forth in the following description or illustrated in the drawings. The invention is applicable to other embodiments being practiced or carried out in various ways. Also, it is to be understood that the phraseology and terminology employed herein is for the purpose of description and should not be regarded as limiting.

Following is a table of definitions of the terms used throughout this application.

| Term | Definition |
| --- | --- |
| Server module | A module implemented in software or hardware or any combination thereof, consisting of all sub modules required for:<br>accumulating data pertinent of HVAC systems power consumption from a plurality of households;<br>analyzing the said data;<br>producing indications of specific HVAC malfunction or inefficiency; and<br>emit alerts regarding conditions of HVAC malfunction or inefficiency. |
| Private Client modules | A module implemented in software or hardware or any combination thereof, configured to interface the server module, and convey data pertaining to a specific HVAC. Said data including at least one of:<br>Household's profile parameters;<br>Residents' profile parameters;<br>HVAC specific information;<br>HVAC power consumption over time;<br>Household's power consumption over time; and<br>Contemporary environmental conditions. |
| Administrative Client module failure indications | These failure indications serve to point out probable system failures or inefficient operation, and are categorized by the following types:<br>Patterns of appliance power consumption,<br>Trends in power consumption,<br>Incompatibility with consumption models, and<br>Top percentage of power consumption. |

-continued

| Term | Definition |
|---|---|
| Household profile parameters | A set of parameters relating to each household, including at least one of: House type (e.g. Flat, Duplex house etc.), Size (Area and Volume), age, geographic location and regional climate, physical location (e.g. top story, south-bound or north-bound). |
| Residents profile parameters | A set of parameters relating to the residents of each household, including at least one of: Number of residents, type of residents (e.g. family, married couple, roommates), lifestyle (i.e. how often they occupy the household) |
| Environmental conditions | Parameters relating to the environment at the location of the monitored household, including at least one of: temperature, humidity, and wind velocity. |
| HVAC-specific data | Data pertaining to specific monitored HVACs within the training group, such as make, model, age, EEC, nominal power consumption etc. |
| Training group | A group of households upon which the classification models are initially trained. Households within the training group present:<br>    Substantial information relating to the household profile parameters and residents' profile parameters;<br>    Regular frequent reading of environmental conditions<br>    Regular frequent reading of HVAC power consumption (e.g. every 15 min.)<br>    Regular frequent reading of overall household power consumption (e.g. every 15 min.) |
| Monitored household group | A group of households beyond the training group, which are classified according to classification subgroups obtained during the training process, by means of calculating each household's best fit to each classification subgroup. Households within the monitored group normally present<br>    Partial information relating to the household profile parameters (e.g. only geographical information)<br>    Partial or no information relating to the household's residents' profile parameters<br>    Partial or no information relating to environmental conditions<br>    No information relating to the HVAC power consumption<br>    Partial or infrequent reading of overall household power consumption (e.g. every day) |
| Top-percentage classification model | |
| Top-percentage classification subgroup | |
| Disaggregation classification model | |
| Disaggregation classification subgroup | |
| Explanatory features | Data that serves to build the "disaggregation" classifier model and the "top percentage" classifier model in the training group, consisting of at least one of:<br>    power consumption of the household over time;<br>    power consumption of the HVAC over time;<br>    HVAC-specific data (e.g. nominal power);<br>    household profile parameters;<br>    residents profile parameters; and<br>    contemporary environmental conditions. |
| Normalized HVAC power consumption | |

Figure 1:
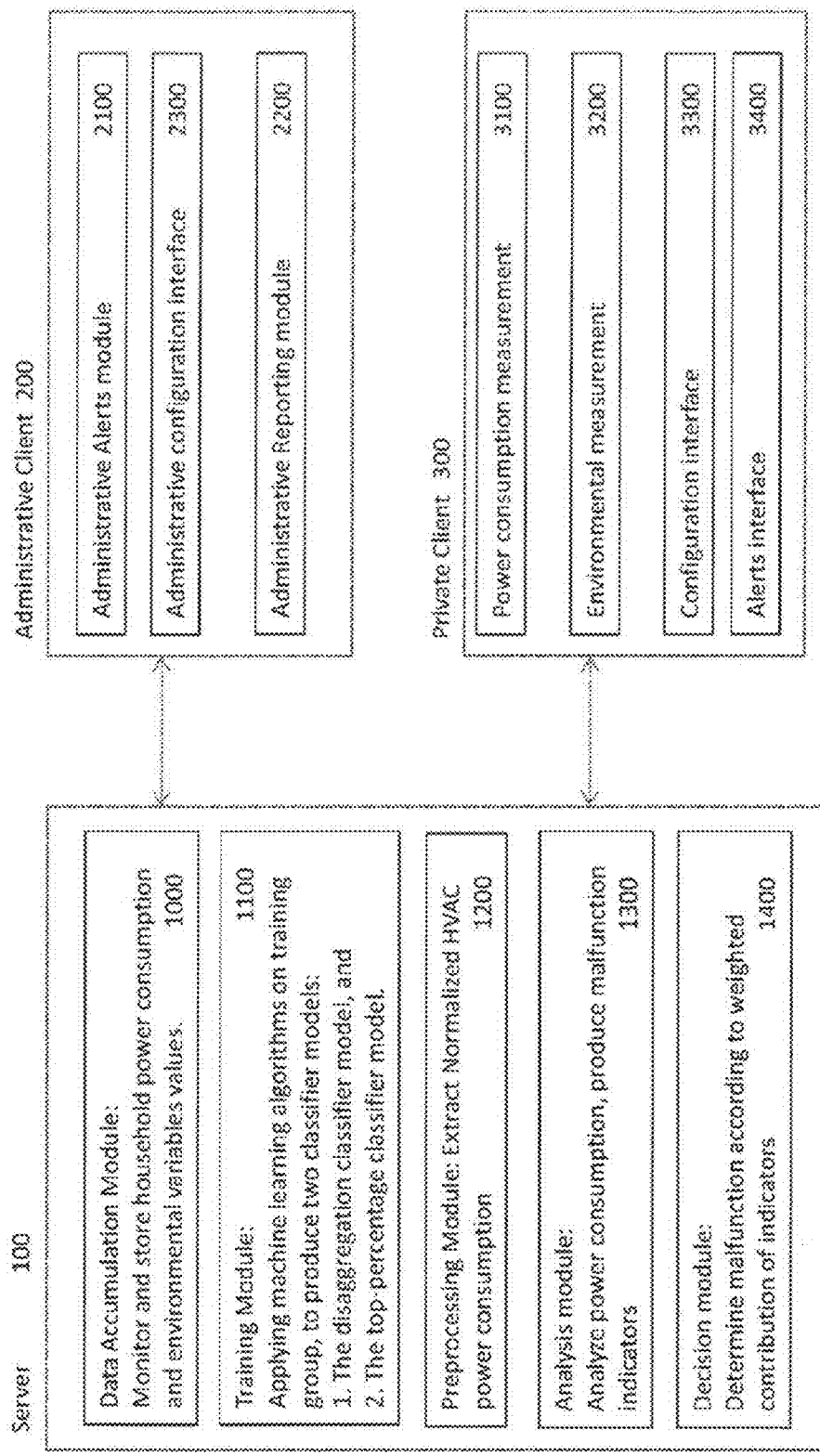
FIG. 1 describes a high level overview of the proposed system wherein multiple client modules extract information from household meters, and propagate this data to a main server according to some embodiments of the present invention.

FIG. 1 describes a high level overview of the proposed system according to some embodiments of the present invention.

The server module 1000 is implemented in software or hardware (such as a computer) or any combination thereof. It is configured to receive regular reading of a plurality of household power consumption meter measurements (not shown), pertaining to a respective plurality of monitored households. In a preferred embodiment, the said power meter data is obtained by the server 1000 in a sub-hourly resolution (e.g. every 15 minutes).

The server module 1000 communicates with a plurality of private client modules 3000, which may reside in households within the training group, according to some embodiments. The client modules 3000 propagate at least one of the following to the server:
Frequent regular power consumption data of the monitored HVAC(s);
Frequent, regular household power consumption data;
Household profile parameters (e.g.: size, location, climate);
HVAC properties (e.g.: make, model, nominal power consumption);
Environmental conditions; and
Resident profile parameters.

The server module 1000 also communicates with an administrative client module 2000, which provides an administrative interface for system configuration, real-time alerts and production of historical reports.

The server module 1000 may reside on any machine that is connected to a communication network. This network can, but is not limited to, be a wireless or wired LAN or WAN network, or a cellular network of any standard. The server module includes several sub modules for aggregating, analyzing and reporting specific properties of the monitored appliances' power consumption, as well as alerting against real time conditions of inefficiency and malfunction. The said sub-modules include at least one of the following:

- The training module 1100: Applying machine learning algorithms on training group, to produce two classifier models: the disaggregation classifier model, and the top-percentage classifier model;
- The data Accumulation module 1100: Accumulating raw real-time environmental data (e.g. temperature, humidity) and power consumption data from multiple private client modules, and storing this information in a database;
- The data preprocessing module 1200: Extracting normalized power consumption data, thus eliminating artifacts, temporary fluctuations, and environmental influences on the monitored data;
- The analysis module 1300: Producing various failure indications for a probable system failure or inefficient operation; and
- The decision module 1400: Producing a status malfunction report of monitored appliances' status.

The private client modules 3000 receive raw data from household power meter measurements and environment sensors and convey it to the server module. The private client modules 3000 communicate with the household power meter to extract household power consumption data, and communicate with additional climatic sensors that provide real time data such as temperature and humidity. The private clients' module comprises of the following sub modules:

- Power consumption measurement module 3100: interfacing the household power meter
- Environmental measurement module 3200: obtaining measurements of temperature and humidity.
- Private Configuration module 3300: Customizing the HVAC's properties (e.g. make and model), the household profile parameters (e.g. location and size), and alerts properties (e.g.: timing and destination)
- Private alerts module 3400: Presenting real time alerts regarding the efficiency and functionality of the HVAC.

The private client modules 3000 communicate with the server module, using data communication network modules such as LAN, WAN, WiFi, GSM, 3GPP, LTE etc.

The administrative client module 2000 is a software module that interfaces the server module 1000. The administrative client module 2000 is configured to provide real time information and system alerts to an administrator. It is also able to convey information to the server module 1000 for purposes of system configuration (e.g. properties of monitored HVACs) and parameter updates (e.g. number of residents in a household). The administrative client module 2000 further enables administrators to produce historical reports.

The Administrative Client's module 2000 may be hosted on any machine or computer that employs the adequate user interface, and that supports the same communication systems as aforementioned in regards to the Server module (e.g. LAN, WAN, WiFi, GSM, 3GPP, LTE etc.).

The administrative clients' module incorporates the following sub modules:

- Administrative alerts module 2100: Presenting real time alerts regarding the efficiency and functionality of all monitored appliance. This module is similar in function, but more extensive than the aforementioned private clients' alerts' module 3400, as it serves to alert a plurality of monitored appliances.
- Administrative reporting module 2200: Setting up and presenting historical reports of previous system conditions and power consumption
- Administrative configuration interface 2300: Introducing and updating information regarding monitored appliances' properties (e.g. make and model), household properties (e.g. location and size), and alerts properties (e.g.: timing and destination). This module is similar in function, but more extensive than the aforementioned private clients' configuration module 3300, as it serves to manage a wider variety of appliances and environments.

Figure 2:
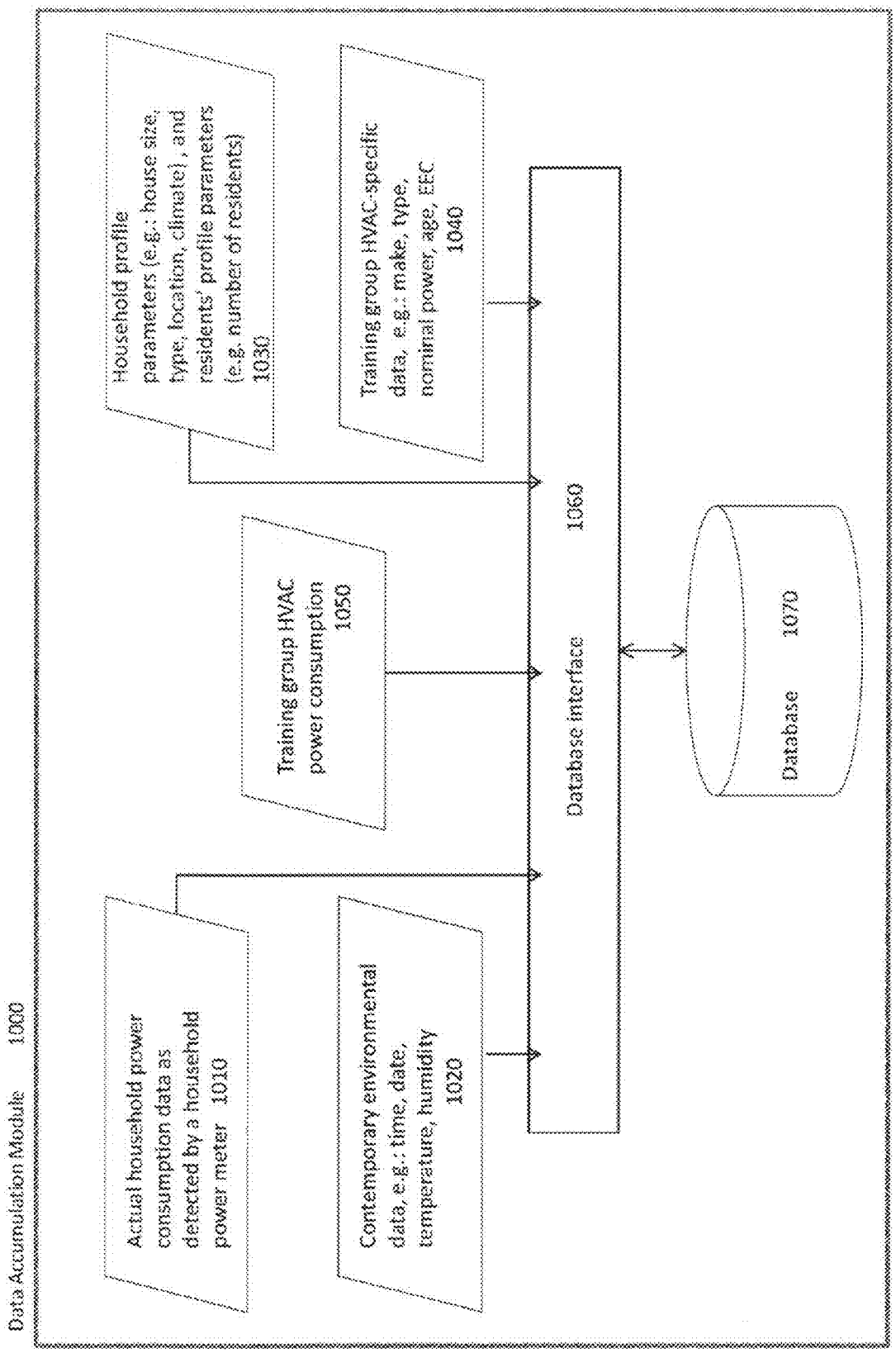
FIG. 2 illustrates a block diagram of the Data Accumulation module according to some embodiments of the present invention. This module resides within the server side, and is responsible for accumulating data from several sources, for further analysis and reporting purposes.

FIG. 2 illustrates the block diagram of the Data Accumulation module according to some embodiments of the present invention. This module aggregates and stores at least one of the following data in a database:

- Measurements of household power consumption data 1110, as detected by the household power meter. According to one embodiment, the household power consumption data 1110 is conveyed to the server module 1000 via the private client's modules 3000.
- Contemporary environmental data 1120 (e.g.: temperature, humidity, wind effect). According to one embodiment, the said contemporary environmental data 1120 may be acquired by respective sensors, physically located at the household's location and conveyed to the server module 1000 via the private clients' modules 3000. According to another embodiment, this data may be acquired from elsewhere, e.g. from online weather services.
- Household profile information 1130 (e.g.: house size, type, location, age geographic location and climate) and residents' profile parameters (e.g. number of residents, and their lifestyle). According to some embodiments, this information is introduced to the server module 1000 via either the private clients 3000 or administrative clients 2000 configuration interfaces (3300 or 2300 respectively).
- According to some embodiments, household profile information 1130 is comprehensively gathered for households that are members of the training group. Households beyond the training group may present only a partial subset of the said household profile information.
- HVAC profile information 1140 (e.g.: make, type, nominal power, age and EER) as introduced by either the private clients' 3000 or administrative clients' 2000 configuration interfaces. This information is comprehensively gathered for households that are members of the training group. Households beyond the training group may or may not present the said HVAC profile information.
- Measurements of training group HVAC power consumption 1150, as detected by the household power meter and conveyed by the private clients' modules 3000 to the server module 1000

According to one embodiment of the present invention, the data accumulation module incorporates an interface 1160 to a database 1170, facilitating the query of accumulated data by other components of the server module 1000 and the administrative client 2000 module.

FIG. 3 illustrates the flow diagram of the training module 1100, according to some embodiments of the present invention. This module resides within the server, and is responsible for dividing the training group dataset of households to classification subgroups according to two classification models: the "disaggregation" model, and the "top-percentage" model.

The training module 1100 acquires the following data per each household within the training group (step 1110):
- power consumption of the household over time;
- power consumption of the HVAC over time;
- HVAC-specific data (e.g. nominal power);
- household profile parameters;
- residents profile parameters; and
- contemporary environmental conditions.

The said acquired data is henceforth referred to as "explanatory features", and serves to build the "disaggregation" classifier model and the "top percentage" classifier model, as elaborated below.

The training module 1100 applies machine learning algorithms to build the disaggregation classifier model over the training group dataset, according to the said explanatory features (step 1120). The application of the said disaggregation classifier model is incorporated in reference PCT/IL2017/050296.

The disaggregation classifier model consists of several classification subgroups. Each disaggregation classification subgroup relates to a specific percentage range of HVAC power consumption from the overall household power consumption, e.g.:
- group 1: households in which 0-10% of household power is consumed by the HVAC;
- group 2: households in which 10-20% of household power is consumed by the HVAC;
- ...
- group 10: households in which 90-100% of household power is consumed by the HVAC.

The training module 1100 accumulates the power consumption data of households within the training group throughout the autumn and spring seasons (step 1130), and divides the training group household dataset into several (e.g. 5) partitions, according to household power consumption during the autumn and spring seasons (step 1140), e.g.:
- partition 1: 20% of households which consume the least amount of energy over autumn and spring seasons;
- partition 2: 20% of households which consume the next amount of energy over autumn and spring seasons;
- ...
- partition 5: 20% of households which consume the most amount of energy over autumn and spring seasons.

The training module 1100 applies machine-learning algorithms to each partition, to build a "top-percentage" classifier model per each partition, according to the said explanatory features (step 1150). The top-percentage classifier model at each partition consists of two groups:
- The "top-percentage" classification subgroup distinguishes households that consume power at the top 1% of power consumption within their partition, and
- The "rest" group includes the rest 99% of the households within that partition.

Figure 4:
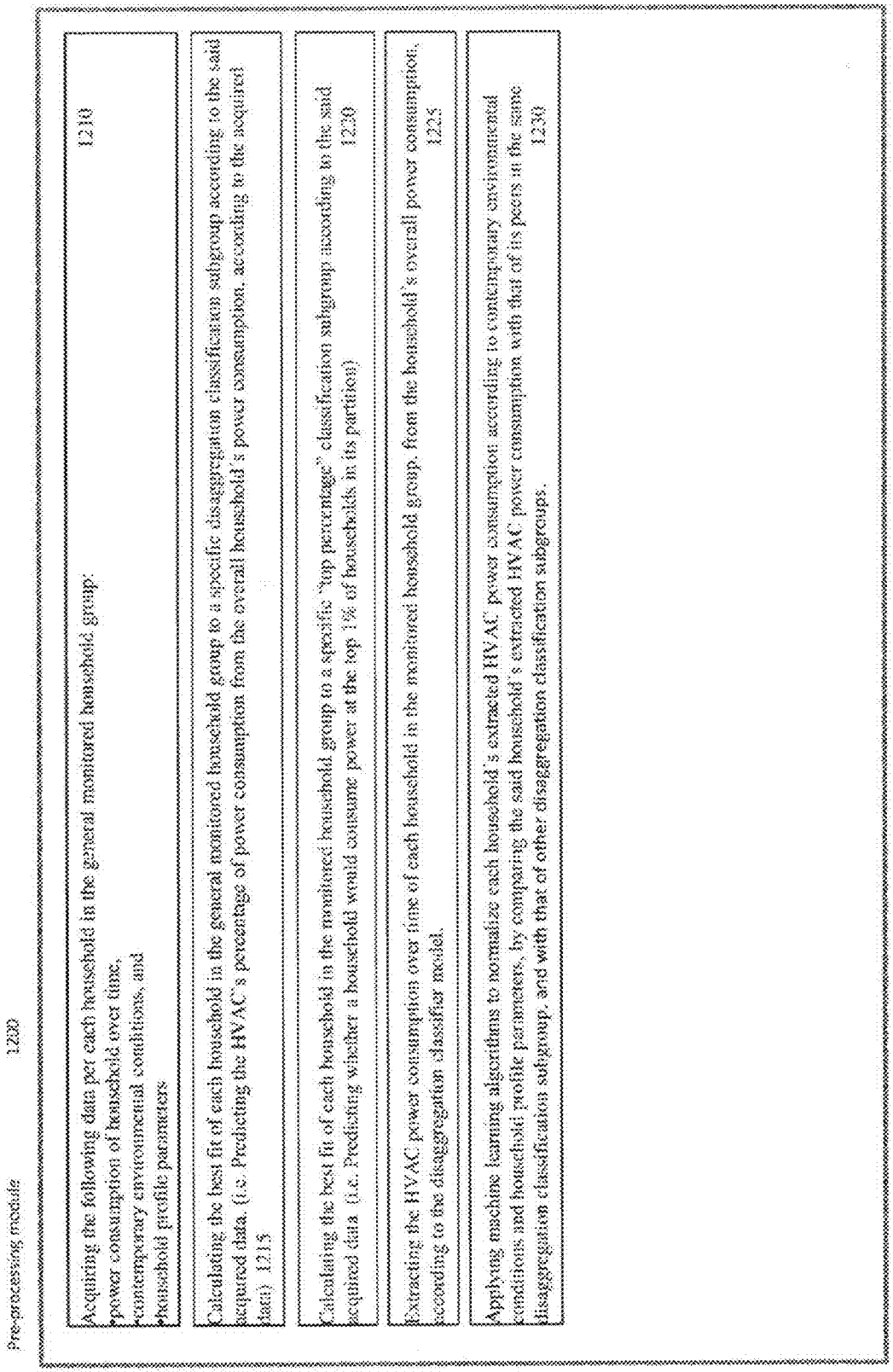
FIG. 4 illustrates the flow diagram of the data preprocessing module according to some embodiments of the present invention. This module resides within the Server side, and is responsible for fitting households from the general monitored household group into classification subgroups defined by the training model, and extracting normalized HVAC power consumption data.

FIG. 4 illustrates the flow diagram of the data preprocessing module 1200, according to one embodiment of the present invention. This module 1200 is responsible for:
a. Fitting households from the monitored household group into specific 'disaggregation' and "top-percentage" classification subgroups, respectively defined by the 'disaggregation' and "top-percentage" classification models in the training module 1100;
b. Extracting normalized HVAC power consumption data from households within the monitored household group, to eliminate artifacts, temporary fluctuations, and the influence of environmental conditions and household profile parameters on the monitored data.

The data preprocessing module 1200 acquires at least one of the following per each household in the general monitored household group (step 1210):
- Power consumption of household over time;
- contemporary environmental conditions; and
- household profile parameters.

The data preprocessing module 1200 calculates the best fit of each household in the monitored household group to a specific disaggregation classification subgroup according to the said acquired data (step 1215). The application of the said disaggregation classifier model is incorporated in reference PCT/IL2017/050296. It thus predicts the HVAC's percentage of power consumption from the overall household's power consumption, according to the acquired data.

The data preprocessing module 1200 calculates the best fit of each household in the monitored household group to a specific "top percentage" classification subgroup according to the said acquired data (step 1220). It thus predicts whether a household would consume power at the top 1% of households in its partition.

The data preprocessing module 1200 extracts the HVAC power consumption over time of each household in the monitored household group, from the household's overall power consumption, according to the disaggregation classifier model (step 1225).

The data preprocessing module 1200 identifies statistical correlations between a known model of the monitored appliance's power consumption and the entire household's power consumption. This process facilitates monitoring the appliance of interest merely by conducting household-level metering. The household's power consumption is thus disaggregated, and the actual HVAC power consumption is extracted for further analysis.

The data preprocessing module 1200 applies machine learning algorithms to normalize each household's extracted HVAC power consumption according to contemporary environmental conditions, residents profiles and household profile parameters, by comparing the said household's extracted HVAC power consumption with that of its peers in the same disaggregation classification subgroup, and with that of other disaggregation classification subgroups (step 1230). For example:
- The data preprocessing module 1200 identifies statistical correlations between the HVAC power consumption and the household's profile parameters (e.g. large houses may require long duty cycle periods for HVAC systems of similar capacity).
- The data preprocessing module 1200 identifies statistical correlations between the HVAC power consumption and environmental conditions over a long period of time. The data preprocessing module 1200 identifies statistical correlations between the HVAC power consumption and residents profile parameters (e.g. HVAC power consumption may affect the overall household's power consumption differently, according to the hours in which the residents occupy the household).

A normalized HVAC power consumption reading is produced over a long period of time (e.g. several days). This reading is normalized by environmental conditions, household profile parameters and residents profile parameters, and is indifferent to minor artifacts and temporary fluctuations in power consumption.

FIGS. 5 thru 8 jointly illustrate a flow diagram, depicting the function of the analysis module 1300, according to one embodiment of the present invention. This module is responsible for producing weighted "Failure indicators", which serve to point out probable HVAC failures or inefficient operation. The said failure indications are categorized according to the following types:

Power consumption patterns;
Trends of increase in power consumption;
Incompatibility with consumption models; and
Top percentage power consumption.

The production of each failure indication type is elaborated below.

FIG. 5 illustrates a flow diagram depicting the production of a failure indication of a "power consumption patterns" type.

Reference is now made to FIGS. 15*a* and 15*b*. FIG. 15*a* depicts a "saw tooth" power consumption pattern that is consistent with normal HVAC power consumption in respect to fluctuations in ambient outdoor temperature (starred: '*'). Note the continuous saw-tooth pattern which is prevalent throughout the HVAC operation period.

FIG. 11*b* depicts an abnormal HVAC power consumption pattern. The HVAC will not recess, and prolonged high power consumption periods are clearly visible, ergo the lack of a "saw tooth" power consumption pattern is an indicator of probable HVAC malfunction.

The analysis module 1300 applies pattern recognition algorithms to the extracted HVAC power consumption data, to produce HVAC power consumption patterns (step 1305). It identifies power consumption patterns that may indicate HVAC malfunction or inefficiency (step 1310).

The analysis module 1300 identifies changes in HVAC power consumption patterns that may indicate appliance malfunction or inefficiency (step 1315).

The analysis module 1300 correlates the identified patterns with contemporary environmental readings, e.g. outdoor temperature and humidity. This correlation serves to determine the significance and relevance of a malfunction pattern based on predefined rules. Corresponding to the previous example: the lack of a saw-tooth pattern for HVAC systems would be a weaker indication of malfunction in conditions of very high outdoor temperature, wherein an HVAC may normally be driven to a state of constant operation, lacking a saw tooth pattern (step 1320). The analysis module 1300 produces a weighted failure indication of the suspected appliance malfunction, according to the pattern recognition process described above. The weight of each failure indication is calculated according to the said indication's degree of certainty.

FIG. 6 illustrates a flow diagram depicting the production of a failure indication of a "Trends in power consumption" type.

The analysis module 1300 applies a trend analysis algorithm, and identifies long-term trends of increase in each household's normalized, extracted HVAC power consumption (step 1330).

The analysis module 1300 correlates said identified trends in HVAC power consumption with contemporary readings of environmental conditions (step 1335), and determines the significance and relevance of a trend indication based on pre-defined rules. For example: a long term increase of power consumption of an HVAC system may indicate a clogged filter, or may be discarded as the onset of summer.

The analysis module 1300 produces a weighted failure indication according to the identified trends in HVAC power consumption (step 1340).

Reference is now made to FIG. 16, which depicts an example for HVAC malfunction identification through a trend of increasing power consumption. The HVAC power consumption seamingly displayed a normal trend of rising power consumption, alongside the rising average outdoor temperature (starred '*'). However after fixing the HVAC unit at the beginning of August, a clear drop in power consumption was observed.

FIG. 7 illustrates a flow diagram depicting the production of a failure indication of an "Incompatibility with consumption models" type.

The analysis module 1300 compares each extracted, normalized HVAC power consumption reading with the expected consumption and EEC (Energy Efficiency Rating) of an HVAC in similar environmental conditions and in regards to similar household profile parameters (step 1345). For example, an HVAC's power consumption during winter time of a household of 5 residents may be compared to the expected consumption of an HVAC in similar conditions.

The analysis module 1300 produces a weighted indication of incompatibility with the expected power consumption values (step 1350).

FIG. 8 illustrates a flow diagram depicting the production of a failure indication of an "top percentage of power consumption" type.

The analysis module 1300 monitors the power consumption of households that are members of the "top-percentage" classification subgroup over time, to ascertain whether they consistently consume power at the top 1% of their partition, over a predefined significant portion of a number of consecutive days (step 1355).

The analysis module 1300 compares the power consumption of the said top-percentage households with that of their peers, i.e. with other households within their disaggregation classification subgroup (step 1360).

The analysis module 1300 produces a weighted failure indication of top percentage of power consumption, said indication weighted according to the indication's degree of certainty.

FIG. 9 illustrates the flow diagram of the decision module 1400, according to one embodiment of the present invention. This module produces a report of the monitored appliances' status. This report serves as a basis for alerting and action taking, in regards to specific monitored appliances.

The decision module 1400 aggregates the weighted values of malfunction indications provided by the analysis module 1300, and filters out temporary or insignificant failure indications according to predefined customization rules (step 1410). For example, an administrator may grant more weight to a specific type of failure indication over another.

The decision module 1400 compares the failure indications with a predefined set of thresholds, to produce a total score for each HVAC's functionality (step 1420). This score may, for example, serve to determine whether to emit an alert to a designated serviceperson.

The decision module 1400 produces metrics according to the weighted levels of failure indications (step 1430). These metrics include the combination of different weighted failure indicators, and the relations thereof. The said metrics serve to point out plausible causes of HVAC failures, in relation to the aforementioned combinations and relations of failure indication weighted levels. The following examples portray cases of appliance failure, and the respective metrics, consisting of combinations of different weighted failure indication levels:

EXAMPLE 1

A Malfunctioned HVAC Compressor Will Produce High Level Indications for

Pattern change: Lack of saw tooth pattern
High power consumption of the HVAC vs similar appliances or household profiles

EXAMPLE 2

Congested HVAC Air Filters Will Produce High Level Indication for

A trend of gradual increase in HVAC power consumption, and
High power consumption in relation to similar appliances.
Possible power consumption at the top percentage of the HVAC's household partition.

The Decision module compares the values enclosed in the said metrics with a set of predefined thresholds, and issues an alert in case said thresholds have been surpassed (step 1440). The alerts will include at least one of the following:
 appliance power consumption pattern malfunction indication;
 Trend of change in power consumption indication;
 Excessive power consumption in comparison to similar appliance systems indication;
 Percentage of power consumption within household partition;
 Filtered sum of the above indications;
 Probability of existence of a condition of HVAC inefficiency or malfunction; and
 Assessment of the cause of malfunction.

FIG. 10 illustrates a block diagram of the administrative clients module 200 environment, according to some embodiments of the present invention. This module is configured to interface the server module, and perform at least one of the following:
 Configure system alerts' settings 2110, such as alert targets (e.g.: SMS, Email, Client module) and timing,
 Receive system alerts 2120,
 Obtain real time power consumption information 2130,
 Obtain historical power consumption and malfunction data 2140 for reporting purposes
 Configure monitored appliances information 2150 (e.g. type, make, model, nominal power)
 Configure monitored household profile parameters 2160 (e.g. house size and location)
 Configure threshold levels for failure indications 2170
 Configure weighted values per each component of failure indications 2180

FIG. 11 illustrates a block diagram of the private client module 300 according to one embodiment of the present invention. The private client module 300 resides in households within the training group, and is responsible for:
 Propagating household profile and residents profile parameters to the server module;
 Propagating real-time physical measurements to the server module; and
 Providing alerting and configuration capabilities for end-users at the monitored HVAC site.

The Configuration module 3300 enables end users to select and configure at least one of the following:
 Household profile parameters (e.g.: house type, size, geographical location and climate);
 Residents profile parameters (e.g. number of residents, and information regarding their lifestyle)
 HVAC parameters (e.g. type, make and model of the HVAC and the number of HVACs in the household); and
 Alert properties: timing and destination (SMS, Email, Web application) of designated alerts.

The information introduced by the end user on the private client configuration interface is propagated to the server module, and is stored in the systems' database for further analysis and reporting purposes.

The power consumption measurement module 3100 extracts periodic measurements of power consumption from the household power meter. It propagates this data to the server module, to be stored in the systems' database for further analysis and reporting purposes.

The environmental measurement interface 3200 extracts periodic measurements of environmental data from respective on-site detectors. This information is appliance-specific and will include at least one of the following:
 Outdoor temperature for HVAC systems
 Indoor temperature for HVAC systems
 Outdoor humidity for HVAC systems
 Indoor humidity
This data is also propagated to the server module, to be stored in the systems' database for further analysis and reporting purposes.

The Private Client Alert interface module 3400 interfaces an alerts' module which invokes at least one of the following:
 A sound and sight alert of any kind (e.g. buzzer, blinking LED) at the monitored household location;
 Alert SMS to a designated communication device;
 Alert Email to a designated account; and
 Alert on an online web application.

FIGS. 12 and 13 jointly present a conceptual block diagram, depicting the function of the analysis module 1300. This module 1300 processes HVAC power consumption data extracted by the preprocessing module 1200, and produces at least one of the following malfunction indications according to:
 Patterns of appliance power consumption indicating malfunction;
 Trends of increase in HVAC power consumption;
 Recognition of incompatibility with models of power consumption of equivalent appliances and work conditions; and
 Power consumption at the top percentage of a household's partition.

FIG. 14 is a conceptual block diagram depicting the function of the decisions module 1400. This module is responsible for aggregating the accumulated indicators' data, and further processing it to reach hard decisions. These decisions include at least one of the following:
 Producing a malfunction alert
 Producing an Inefficiency alert
 Producing an Indication of probable cause for malfunction or system inefficiency
 Suggest an action to solve the problem According to some embodiments, the processing of identifying malfunction type is based on applying algorithms of machine learning for identifying correlation between, power consumption pattern weight values of different the failure indications and type of malfunction.

The present invention may be described, merely for clarity, in terms of terminology specific to particular programming languages, operating systems, browsers, system versions, individual products, and the like. It will be appreciated that this terminology is intended to convey general principles of operation clearly and briefly, by way of example, and is not intended to limit the scope of the invention to any particular programming language, operating system, browser, system version, or individual product.

It is appreciated that software components of the present invention including programs and data may, if desired, be implemented in ROM (read only memory) form including CD-ROMs, EPROMs and EEPROMs, or may be stored in any other suitable typically non-transitory computer-readable medium such as but not limited to disks of various kinds, cards of various kinds and RAMs. Components described herein as software may, alternatively, be implemented wholly or partly in hardware, if desired, using conventional techniques. Conversely, components described herein as hardware may, alternatively, be implemented wholly or partly in software, if desired, using conventional techniques.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code, such as executable code, having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; electronic devices each including a processor and a cooperating input device and/or output device and operative to perform in software any steps shown and described herein; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or clients for using such; and hardware which performs any or all of the steps of any of the methods shown and described herein, in any suitable order, either alone or in conjunction with software. Any computer-readable or machine-readable media described herein is intended to include non-transitory computer- or machine-readable media.

Any computations or other forms of analysis described herein may be performed by a suitable computerized method. Any step described herein may be computer-implemented. The invention shown and described herein may include (a) using a computerized method to identify a solution to any of the problems or for any of the objectives described herein, the solution optionally include at least one of a decision, an action, a product, a service or any other information described herein that impacts, in a positive manner, a problem or objectives described herein; and (b) outputting the solution.

The scope of the present invention is not limited to structures and functions specifically described herein and is also intended to include devices which have the capacity to yield a structure, or perform a function, described herein, such that even though users of the device may not use the capacity, they are, if they so desire, able to modify the device to obtain the structure or function.

Features of the present invention which are described in the context of separate embodiments may also be provided in combination in a single embodiment.

For example, a system embodiment is intended to include a corresponding process embodiment. Also, each system embodiment is intended to include a server-centered "view" or client centered "view", or "view" from any other node of the system, of the entire functionality of the system, computer-readable medium, apparatus, including only those functionalities performed at that server or client or node.

The invention claimed is:

1. A method for determining conditions of malfunction or inefficiency of Heating Ventilation and Air Conditioning (HVAC) systems, within a plurality of monitored households, in which there are no sensors for directly measuring the power consumption per specific HVAC, said method implemented by one or more processors operatively coupled to a non-transitory computer readable storage device, on which are stored modules of instruction code that when executed cause the one or more processors to perform:
   a. monitoring the power consumption of a plurality of households, wherein said monitored power consumption includes only the total consumption of each household;
   b. monitoring the concurrent environmental conditions at the location of the said plurality of households;
   c. analyzing each household's total power consumption and extracting weighted failure indications of inefficient or malfunctioning HVAC systems, wherein the analyzing is implemented by applying machine learning algorithm; wherein the malfunction indications include at least one of the following: power consumption pattern, trends of increase in power consumption, incompatibility with consumption models or top percentage power consumption;
   d. determining the probability of various HVAC conditions of malfunction or inefficiency, according to the said weighted indicators;
   e. emitting an alert in relation to the said condition of HVAC malfunction or inefficiency, comprising at least one of: HVAC malfunction type, probability, probable cause, and suggested action.

2. A method for determining conditions of malfunction or inefficiency of Heating Ventilation and Air Conditioning (HVAC) systems, within a plurality of monitored households, in which there are no sensors for directly measuring the power consumption per specific HVAC, said method implemented by one or more processors operatively coupled to a non-transitory computer readable storage device, on which are stored modules of instruction code that when executed cause the one or more processors to perform:

a. monitoring the power consumption of a plurality of households;
b. monitoring the concurrent environmental conditions at the location of the said plurality of households;
c. analyzing each household's power consumption, and extracting weighted failure indications of inefficient or malfunctioning HVAC systems;
d. determining the probability of various HVAC conditions of malfunction or inefficiency, according to the said weighted indicators;
e. emitting an alert in relation to the said condition of HVAC malfunction or inefficiency, comprising at least one of: HVAC malfunction type, probability, probable cause, and suggested action;

wherein the analysis of households' power consumption is performed according to the following steps:
a. obtaining elaborate data pertaining to each household within a household training group;
b. applying machine learning algorithms to the said accumulated training group data, to build at least one classification model, thus classifying the households' training group to form classification subgroups;
c. obtaining power consumption data and household profile information pertaining to a general group of monitored households, beyond the household training group;
d. calculating the best fit of every household in the monitored group of households to said classification subgroups;
e. extracting weighted failure indications of inefficient or malfunctioning HVAC systems.

3. The method of claim 2 wherein the said data pertaining to each household within the household training group consists of at least one of: household power consumption, HVAC power consumption, contemporary environmental conditions, household profile parameters, residents' profile parameters, and HVAC specific data.

4. The method of claim 3, wherein one of said classification models is a disaggregation classification model.

5. The method of claim 4, wherein said disaggregation classification model includes disaggregation classification subgroups, each subgroup relating to a specific percentage range of HVAC power consumption from the overall household power consumption.

6. The method of claim 5, further including calculation of the best fit of every household in the monitored group of households to a said disaggregation classification subgroup, thus extracting the HVAC power consumption over time of each household in the monitored household group from the household's overall power consumption reading.

7. The method of claim 6, further applying a pattern recognition algorithm to the said extracted HVAC-specific power consumption over time, thus producing HVAC power consumption patterns, identifying power consumption patterns that indicate HVAC malfunction or inefficiency, and emitting an HVAC power-consumption-pattern failure indication weighted by the indicated malfunction's degree of certainty.

8. The method of claim 6, further applying a machine learning algorithm for normalizing the said extracted HVAC power consumption according to contemporary environmental conditions, residents' profiles and household profile parameters, by comparing the said household's extracted HVAC power consumption with that of its peers in the same disaggregation classification group, and with that of other disaggregation classification subgroups.

9. The method of claim 8, further comprising the steps of:
a. applying a trend analysis algorithm to identify trends of increase in HVAC power consumption that are normalized in relation to environmental conditions; and
b. emitting an indication of HVAC malfunction, according to said identified trend of increase in normalized power consumption, wherein said indication is weighted by the indicated malfunction's degree of certainty.

10. The method of claim 8, further comprising the steps of:
a. comparing the extracted, normalized HVAC power consumption with the expected consumption and EEC (Energy Efficiency Rating) of HVACs in similar environmental conditions and in regards to similar household profile parameters;
b. emitting an indication of HVAC malfunction, according to said comparison with expected consumption and EEC, wherein said indication is weighted by the indicated malfunction's degree of certainty.

11. The method of claim 10, further comprising the steps of:
a. dividing the households of the training group to partitions according to household power consumption during the autumn and spring seasons;
b. applying machine-learning algorithms to each partition, thus building a top-percentage classifier model per each partition;
c. wherein the top-percentage classifier model at each partition distinguishes the households that consume power at the top 1% of power consumption within their partition from the rest of the households within their partitions.

12. The method of claim 11, wherein the households that consume power at the top 1% of their partition are monitored over a predefined number of consecutive days, to ascertain the following conditions:
the said households consistently consume power at the top 1% of their partition, over a predefined significant portion of the said predefined number of consecutive days; and
the power consumption of the said households exceeds that of other households within their disaggregation classification subgroup,
whereupon a failure indication of HVAC malfunction is emitted in case both said conditions are fulfilled, wherein said indication is weighted by the indicated malfunction's degree of certainty.

13. The method of claim 12, further comprising the steps of:
a. aggregating all said types of HVAC malfunction indications;
b. comparing the weighted values of malfunction indications with a predefined set of thresholds, and producing a total score for each HVAC's functionality;
c. producing metrics according to the weighted levels of said aggregated failure indicators;
d. wherein said metrics including combinations of different failure indication levels, and relations thereof;
e. determining the existence and probability of an HVAC condition of malfunction or inefficiency; and
f. emitting an alert in relation to said determination of HVAC malfunction or inefficiency, comprising at least one of: HVAC malfunction type, probability, probable cause, and suggested action according to said metrics.

14. A system for determining conditions of malfunction or inefficiency of Heating Ventilation and Air Conditioning (HVAC) systems, within a plurality of monitored households, in which there are no sensors for directly measuring the power consumption per specific HVAC, said system comprising:

a. a non-transitory computer readable storage device and one or more processors operatively coupled to the storage device on which are stored modules of instruction code executable by the one or more processors;

b. a plurality of household power meters, installed at a respective plurality of monitored households, said meters transmitting regular household power consumption readings to a server module;

c. the said server module, configured to monitor the said regular household power consumption and the concurrent environmental conditions at the location of the said plurality of monitored households, wherein said monitored power consumption includes only the total consumption of each household;

d. a preprocessing module incorporated within the server module, configured to analyze each household's total power consumption and extract weighted failure indications of inefficient or malfunctioning HVAC systems, wherein the analyzing is implemented by applying machine learning algorithm; wherein the malfunction indications include at least one of the following: power consumption pattern, trends of increase in power consumption, incompatibility with consumption models or top percentage power consumption; and e. a decision module incorporated within the server module, configured to determine the probability of various HVAC conditions of malfunction or inefficiency, according to the said weighted failure indications, wherein said decision module is configured to emit an alert in relation to the said determined condition of HVAC malfunction or inefficiency, alert comprising at least one of: HVAC malfunction type, probability, probable cause, and suggested action.

15. The system of claim 14 further comprising a plurality of private client modules installed at households within a household training group, wherein said private client modules convey data pertaining to each household within the household training group to the server module, said data including at least one of: household power consumption, HVAC power consumption, contemporary environmental conditions, household profile parameters, residents' profile parameters, and HVAC specific data.

16. The system of claim 14, further comprising a training module incorporated within the server module, and configured to a. obtain elaborate data from the private client modules, pertaining to each household within the household training group; and b. apply machine learning algorithms to the said accumulated training group data, to build at least one classification model, thus classifying the households' training group to form classification subgroups.

17. The system of claim 14, wherein the said analysis module is further configured to:

a. obtain power consumption data pertaining to a general group of monitored households, beyond the household training group;

b. calculate the best fit of every household in the monitored group of households to said classification subgroups; and c. extract weighted failure indications of inefficient or malfunctioning HVAC systems.

18. The system of claim 17, wherein the said weighted failure indications of inefficient or malfunctioning HVAC systems include at least one of:

power consumption patterns failure indication;

trends of increase in power consumption failure indication;

incompatibility with consumption models failure indication; and top percentage power consumption failure indication.

* * * * *